(12) United States Patent
Leete

(10) Patent No.: US 7,212,801 B2
(45) Date of Patent: *May 1, 2007

(54) ELECTROSTATIC PROTECTION CIRCUIT WITH IMPEDANCE MATCHING FOR RADIO FREQUENCY INTEGRATED CIRCUITS

(75) Inventor: John C. Leete, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 376 days.

This patent is subject to a terminal disclaimer.

(21) Appl. No.: 10/884,034

(22) Filed: Jul. 2, 2004

(65) Prior Publication Data

US 2004/0240131 A1 Dec. 2, 2004

Related U.S. Application Data

(63) Continuation of application No. 10/172,913, filed on Jun. 17, 2002, now Pat. No. 6,771,475.

(51) Int. Cl.
*H04B 1/10* (2006.01)
*H02H 9/06* (2006.01)

(52) U.S. Cl. ................. 455/307; 455/217; 361/56; 361/119

(58) Field of Classification Search ............... 455/307, 455/217, 80–84, 121, 76–78, 280, 550.1, 455/90.3, 575.1; 361/55–58, 110–111, 117–119, 361/113, 91.1; 333/133
See application file for complete search history.

(56) References Cited

U.S. PATENT DOCUMENTS 6,714,099 B2 * 3/2004 Hikita et al. ................ 333/133
6,771,475 B2 * 8/2004 Leete .......................... 361/56
6,914,570 B2 * 7/2005 Asrani et al. ............... 343/702
7,010,279 B2 * 3/2006 Rofougaran ................ 455/121
2004/0212937 A1 * 10/2004 Marholev .................... 361/56
2005/0041347 A1 * 2/2005 Khorram .................... 361/56
2005/0136866 A1 * 6/2005 Dupuis ................... 455/127.1
2005/0270711 A1 * 12/2005 Marholev .................... 361/56

* cited by examiner

*Primary Examiner*—Aung Moe
(74) *Attorney, Agent, or Firm*—Garlick Harrison & Markison; Bruce E. Garlick

(57) ABSTRACT

An electrostatic-discharge/impedance-matching circuit for use in radio frequency (RF) integrated circuits. The electrostatic-discharge/impedance-matching circuit includes at least one shunt circuit operable to shunt current related to an over-voltage condition and at least one series element operably coupled to the shunt element. The shunt element and series element in combination provide electrostatic discharge protection for the RF signal processing circuit elements on the integrated circuit and also provide a matched input impedance for an incoming RF signal. Various alternate embodiments of die electrostatic-discharge/impedance-matching circuit include first and second shunt elements and a series element operably connected in combination to provide optimal electrostatic discharge protection and impedance matching. The electrostatic-discharge/impedance-matching circuit can be placed at various locations on the integrated circuit to provide optimal petformance depending on the particular architecture of the integrated circuit.

20 Claims, 10 Drawing Sheets

ELECTROSTATIC PROTECTION CIRCUIT WITH IMPEDANCE MATCHING FOR RADIO FREQUENCY INTEGRATED CIRCUITS

CROSS REFERENCE TO RELATED APPLICATION

This application is a continuation of U.S. Utility application Ser. No. 10/172,913, filed Jun. 17, 2002, which issued on Aug. 3, 2004 as U.S. Utility Pat. No. 6,771,475).

FIELD OF THE INVENTION

This invention relates generally to communication systems and, more particularly, to circuitry for providing electrostatic protection and impedance matching for radio frequency circuit components in integrated circuits.

BACKGROUND OF THE INVENTION

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), wireless application protocols (WAP), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel (e.g., one of the plurality of radio frequency (RF) carriers of the wireless communication system) and share information over that channel. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals via one or more intermediate frequency stages, and demodulates the signals in accordance with a particular wireless communication standard to recapture the transmitted data. The transmitter converts data into RF signals by modulating the data in accordance with the particular wireless communication standard and adds an RF carrier to the modulated data in one or more intermediate frequency stages to produce the RF signals.

As the demand for enhanced performance (e.g., reduced interference and/or noise, improved quality of service, compliance with multiple standards, increased broadband applications, et cetera), smaller sizes, lower power consumption, and reduced costs increases, wireless communication device engineers are faced with a very difficult design challenge to develop such a wireless communication device. Typically, an engineer is forced to compromise one or more of these demands to adequately meet the others.

Costs of manufacturing a radio frequency integrated circuit (IC) may be reduced by switching from one integrated circuit manufacturing process to another. For example, a CMOS process may be used instead of a bi-CMOS process since it is a more cost effective method of IC manufacture, but the CMOS process increases component mismatches, increases temperature related variations, and increases process variations.

Two problems commonly encountered in the design and manufacture of RF signal integrated circuits relate to impedance matching of various RF signal processing components and control of electrostatic discharges to prevent damage to components inside the integrated circuit. Proper impedance matching is important for an efficient transfer of signal and energy from a "source" to a "load." In an integrated circuit for processing RF signals, impedance matching is especially important to ensure an efficient transfer of an RF signal from the antenna to a receiver filter module or a low-noise amplifier.

Electrostatic discharges are well known as a major contributing factor in damaging integrated circuits—both during the manufacturing process and during use of the circuit. Integrated Circuits often come into contact with accumulated static charge on surfaces such as the human body and assembly equipment. The voltage potential that accompanies such built up static charge is often on the order of Kilovolts. When accumulated static charge finds a discharge path through the pins of an integrated circuit, often through contact, electrostatic discharge occurs. These events can result in highly concentrated currents that cause severe heating in the physical circuit devices of an integrated circuit. Severe heating can cause permanent damage to these devices. Therefore, protective circuits or structures must be employed to prevent damage caused by electrostatic discharge. Electrostatic protection circuits must be capable of quickly and efficiently routing electrostatic discharge between any combination of pins of an integrated circuit, eliminating significant voltage differential and preventing damage to circuit devices.

Therefore, a need exists for circuit that can be optimized to provide both impedance matching and protection from the damaging effects of electrostatic discharges.

SUMMARY OF THE INVENTION

The electrostatic-discharge/impedance-matching circuit disclosed herein for use in radio frequency (RF) integrated circuits substantially meets these needs and others. The electrostatic-discharge/impedance-matching circuit of the present invention is broadly comprised of at least one shunt circuit operable to shunt current related to an over-voltage condition and at least one series element operably coupled to the shunt element. The shunt element and series element in combination provide electrostatic discharge protection for the RF signal processing circuit elements on the integrated circuit and also provide a matched input impedance for an incoming RF signal. Various alternate embodiments of the electrostatic-discharge/impedance-matching circuit include first and second shunt elements and a series element operably connected in combination to provide optimal electrostatic discharge protection and impedance matching.

The electrostatic-discharge/impedance-matching circuit can be placed at various locations on the integrated circuit to provide optimal performance depending on the particular architecture of the integrated circuit. In one embodiment, the electrostatic-discharge/impedance-matching circuit it located between a transmitter/receiver switch module and an antenna receiving incoming RF signals. In another embodiment, the electrostatic-discharge/impedance-matching switch is located directly between an antenna and a receiver filter module. In other embodiments, the electrostatic-discharge/impedance-matching circuit is located between a receiver filter module and a low-noise amplifier.

Other features and advantages of the present invention will become apparent from the following detailed description of the invention made with reference to the accompanying drawings.

DETAILED DESCRIPTION

Figure 1:
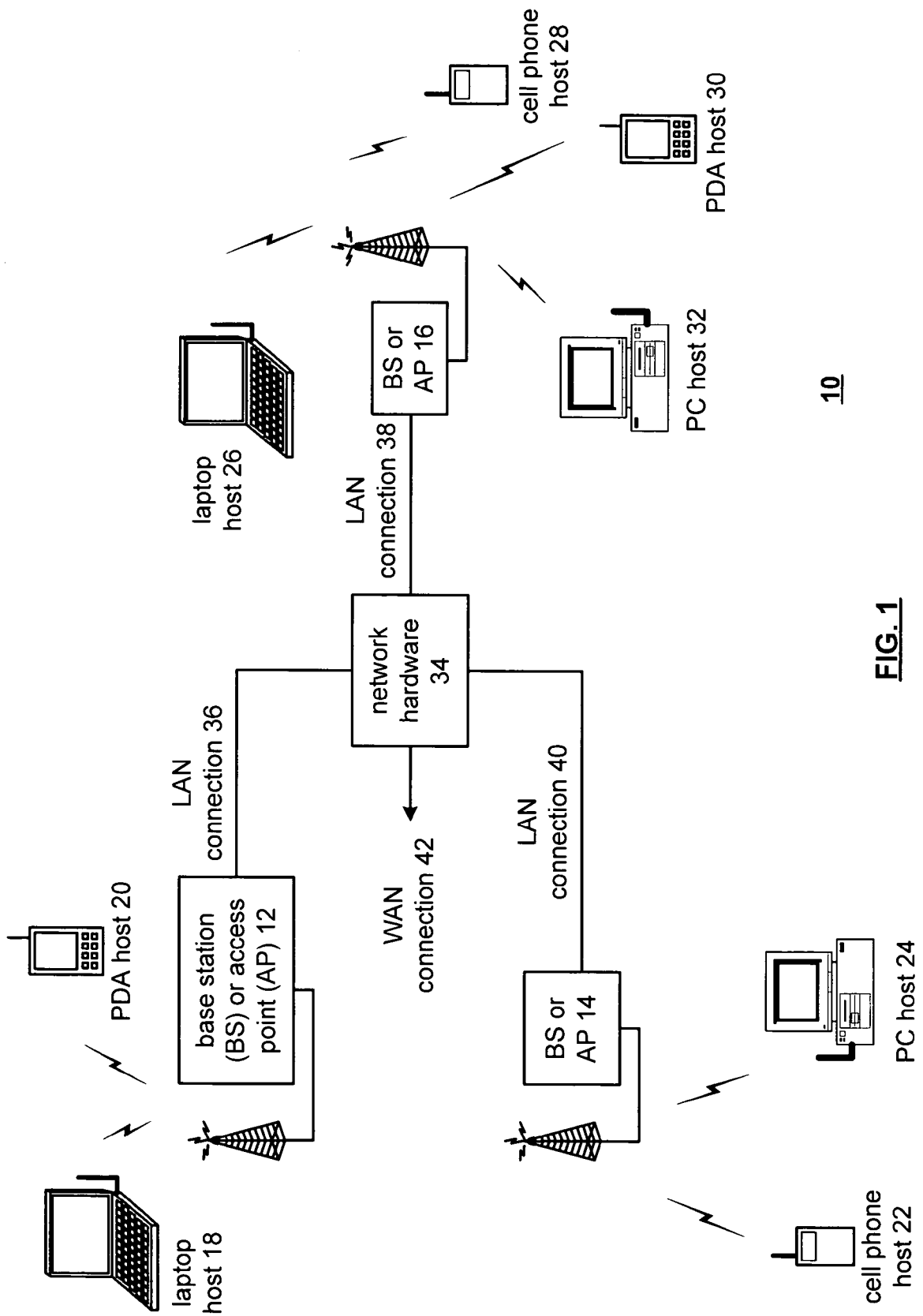
FIG. 1 illustrates a schematic block diagram of a wireless communication system that supports wireless communication devices in accordance with the present invention.

FIG. 1 is a schematic block diagram illustrating a communication system 10 that includes a plurality of base stations and/or access points 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12–16 has an associated antenna or antenna array to communicate with the wireless communication devices in its area. Typically, the wireless communication devices register with a particular base station or access point 12–14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
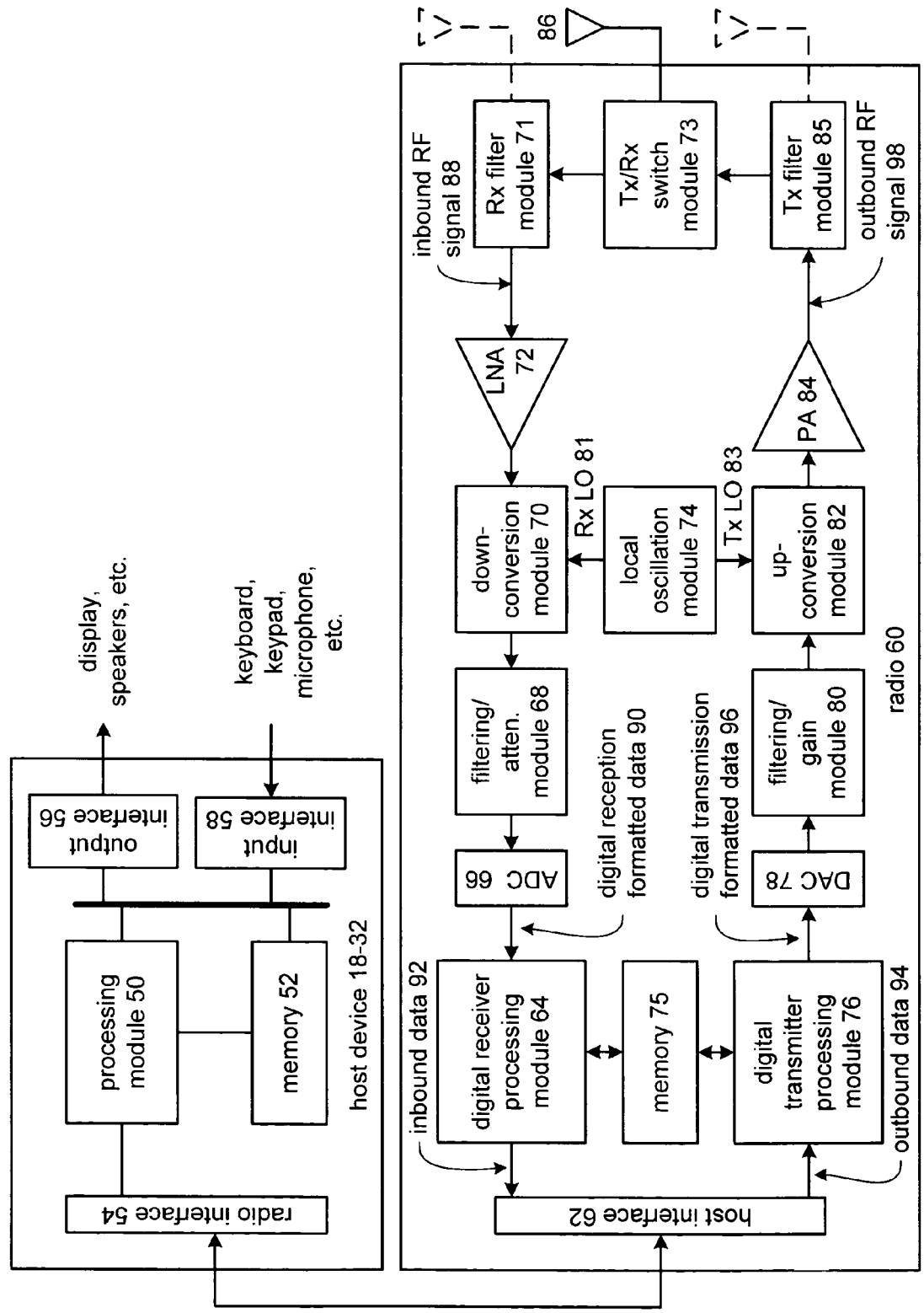
FIG. 2 illustrates a schematic block diagram of a wireless communication device in accordance with the present invention.

FIG. 2 is a schematic block diagram illustrating a wireless communication device that includes the host device 18–32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18–32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low-noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions corresponding to at least some of the functions illustrated in FIGS. 3–10.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low-noise amplifier 72, which amplifies the signal 88 to produce an amplified inbound RF signal. The low-noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/attenuation module 68. The filtering/attenuation module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18–32 via the radio interface 54.

As one skilled in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

It will be understood by those skilled in the art that the various circuit components illustrated in FIG. 2 can be constructed on a monolithic integrated circuit. The individual integrated circuit components can be damaged by electrostatic discharge over-voltage conditions that are often created on the boundary of the integrated circuit and conducted through the integrated circuit connecting pins. While the advantages of the electrostatic-discharge/impedance-matching circuit of the present invention can be obtained by placing the circuit in a multitude of locations on the integrated circuit, there are particular advantages associated with locating it at the boundary of the integrated circuit to prevent damage associated with electrostatic discharges transmitted through the integrated circuit connecting pins. In each of the embodiments described herein, the electrostatic-discharge/impedance-matching circuit may be formed upon an integrated circuit at a boundary of the integrated circuit. Formed at the boundary of the integrated circuit, the electrostatic-discharge/impedance-matching circuit provides protection from electrostatic-discharge at a respective input and also impedance-matching at the respective input.

Figure 3:
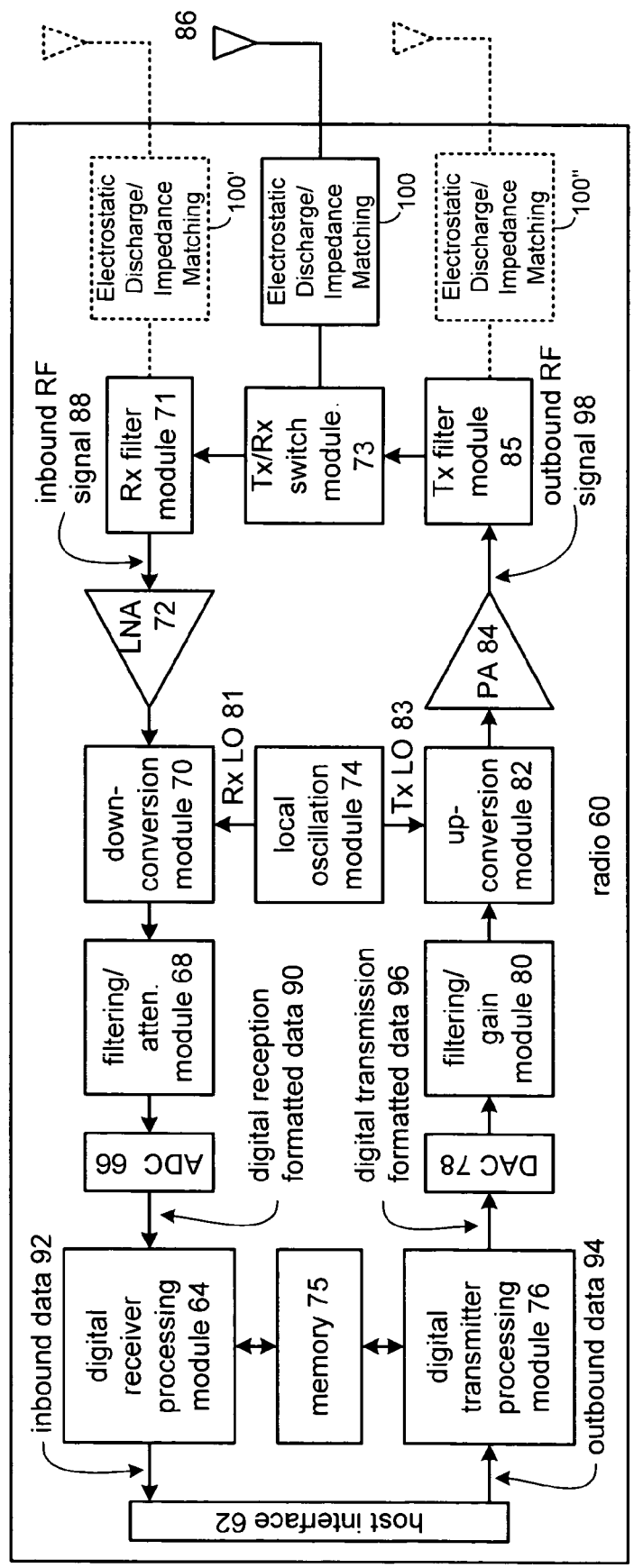
FIG. 3 illustrates a schematic block diagram of a radio module of a wireless communication device incorporating an electrostatic-discharge/impedance-matching circuit in accordance with the present invention.

FIG. 3 illustrates an embodiment of the present invention wherein the electrostatic-discharge/impedance-matching circuit 100 is connected between the Tx/Rx switch module 73 and the antenna 86. The electrostatic-discharge/impedance-matching circuit 100', shown in phantom, illustrates a connection of the circuit 100 to the Rx filter module 71 during operation when the Tx/Rx switch module 73 connects the antenna 86 to the Rx filter module 71. In the illustration shown in FIG. 3, all of the circuit components of the radio 60 are formed ("on-chip") on a single integrated circuit and the electrostatic-discharge/impedance-matching circuit 100 is located on the boundary of the chip to protect against damage from static discharges at the input connection where the an inbound RF signal is received from the antenna 86.

As will be discussed in greater detail below, the electrostatic-discharge/impedance-matching circuit 100 comprises a combination of circuit components that provide matched input impedance to the antenna 86. Further, the electrostatic-discharge/impedance-matching circuit 100 may also provide desired output impedance to the RF filter module 71. While the components of the electrostatic-discharge/impedance-matching circuit 100 can be selected to provide a wide range of matching impedances, depending on the specific application, typical matched impedance as presented to the antenna 86 is 50 ohms.

Figure 4:
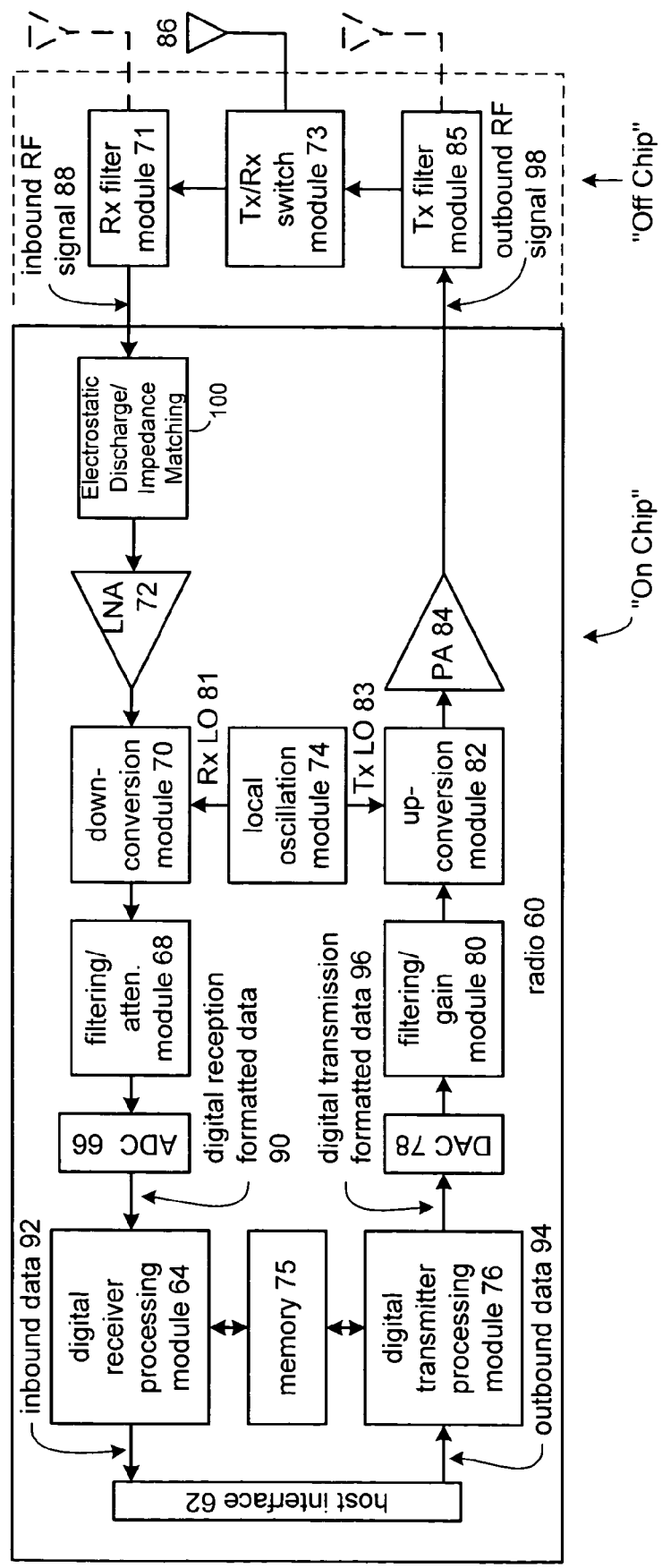
FIG. 4 illustrates a schematic block diagram of an alternate embodiment radio module of a wireless communication device incorporating an electrostatic-discharge/impedance-matching circuit in accordance with the present invention.

FIG. 4 illustrates an embodiment of the present invention wherein the electrostatic-discharge/impedance-matching circuit 100 is connected between the Rx filter module 71 and the low-noise amplifier 72. In the illustration shown in FIG. 4, the circuit components for the Tx/Rx switch module 73, the Tx filter module 85 and the Rx filter module are formed "off-chip," while all of the other circuit components of the radio 60 are formed on a single integrated circuit. The electrostatic-discharge/impedance-matching circuit 100 is, therefore, located on the boundary of the chip to protect against damage from static discharges at the input connection where an inbound RF signal is received from the Rx filer module 71. The electrostatic-discharge/impedance-matching circuit 100 comprises a combination of circuit components that provide matched input impedance to the Rx filter 71. The electrostatic-discharge/impedance-matching circuit 100 may also provide a desired output impedance to the low-noise amplifier 72.

Figure 5:
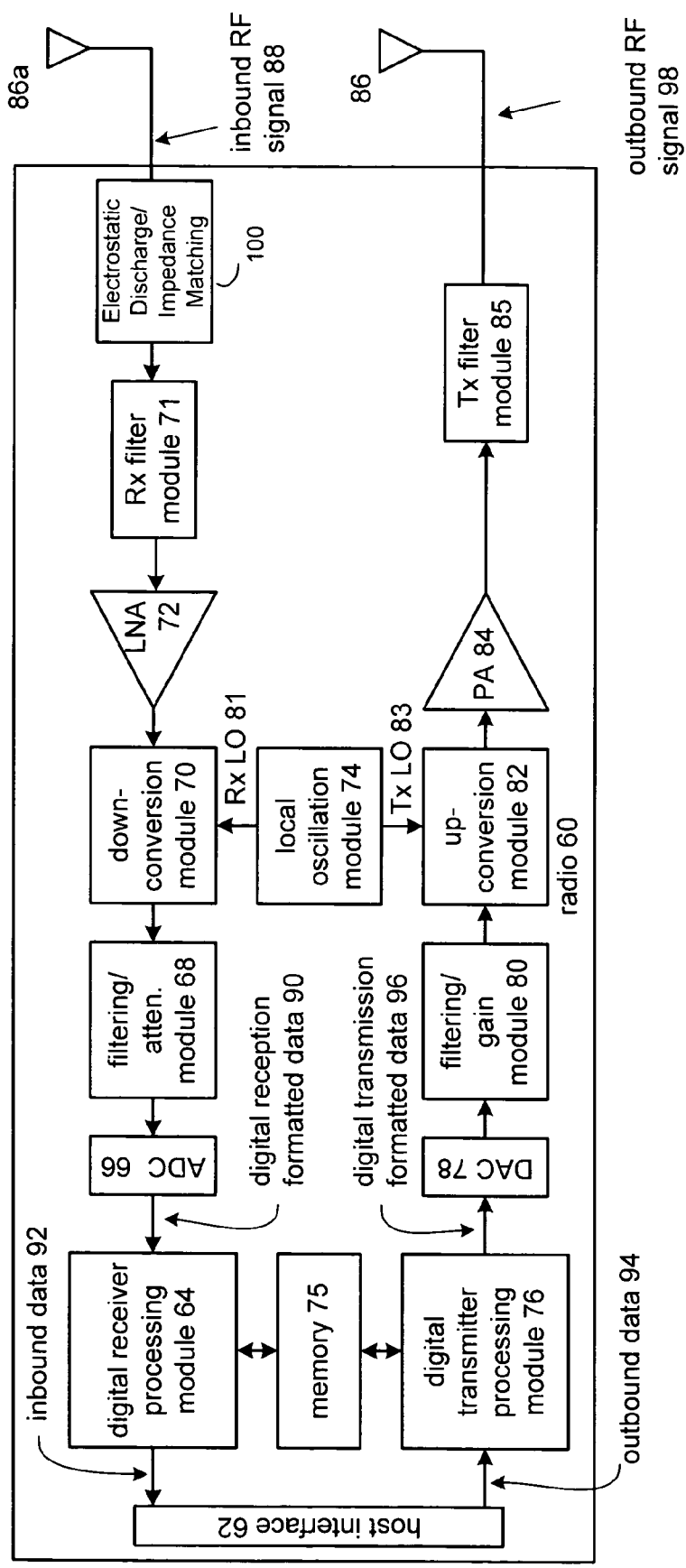
FIG. 5 illustrates a schematic block diagram of a second alternate embodiment of a radio module of a wireless communication device incorporating an electrostatic-discharge/impedance-matching circuit in accordance with the present invention.

FIG. 5 illustrates an embodiment of the present invention in a radio 60 that does not comprise a Tx/Rx switch module. In this embodiment, the outbound RF signal 98 from Rx filter module 85 is transmitted on antenna 86, while the inbound RF signal 88 is received on a separate antenna 86a. The electrostatic-discharge/impedance-matching circuit 100 is connected between the antenna 86a and the input to the Rx filter module 71. In the illustration shown in FIG. 5, all of the circuit components of the radio 60 are formed on a single integrated circuit and, therefore, the electrostatic-discharge/impedance-matching circuit 100 is located on the boundary of the chip to protect against damage from static discharges at the input connection where the an inbound RF signal is received from the antenna 86a.

Figure 6:
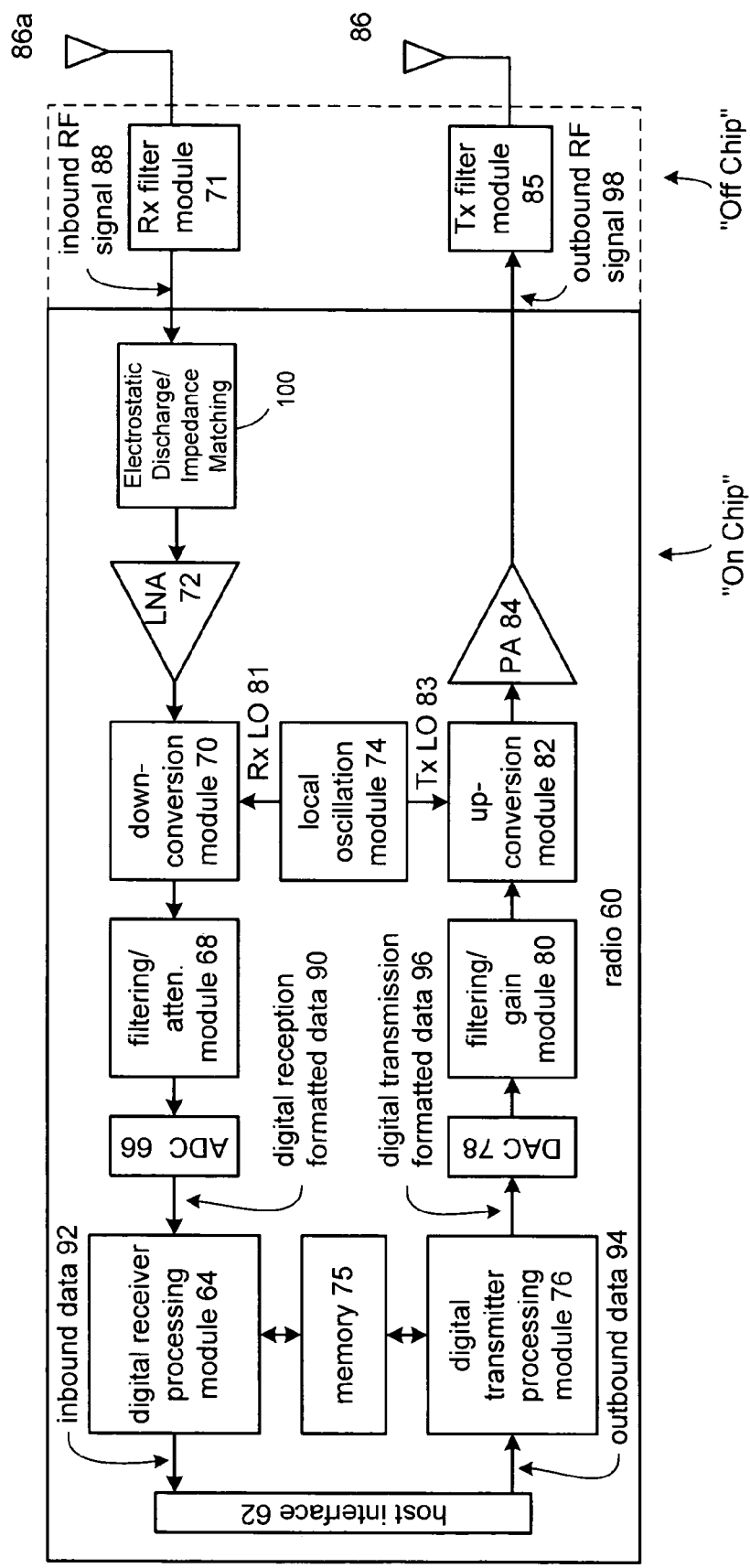
FIG. 6 illustrates a schematic block diagram of a third alternate embodiment radio module of a wireless communication device incorporating an electrostatic-discharge/impedance-matching circuit in accordance with the present invention.

FIG. 6 illustrates another embodiment of the present invention wherein the electrostatic-discharge/impedance-matching circuit 100 is incorporated into a radio 60 that utilizes separate transmit and receive antennas 86 and 86a, respectively. In this embodiment, the electrostatic-discharge/impedance-matching circuit 100 is connected between the Rx filter module 71 and the low-noise amplifier 72. In the illustration shown in FIG. 6, the circuit components for the Tx filter module 85 and the Rx filter module are formed "off-chip," while all of the other circuit components of the radio 60 are formed on a single integrated circuit. The electrostatic-discharge/impedance-matching circuit 100 is, therefore, located on the boundary of the chip to protect against damage from static discharges at the input connection where an inbound RF signal is received from the Rx filer module 71. Again, as discussed in connection with previous embodiments, the electrostatic-discharge/impedance-matching circuit 100 comprises a combination of circuit components that provide a predetermined impedance that provides a matched impedance between the output of the Rx filter 71 and the input to the low-noise amplifier 72.

Figure 7:
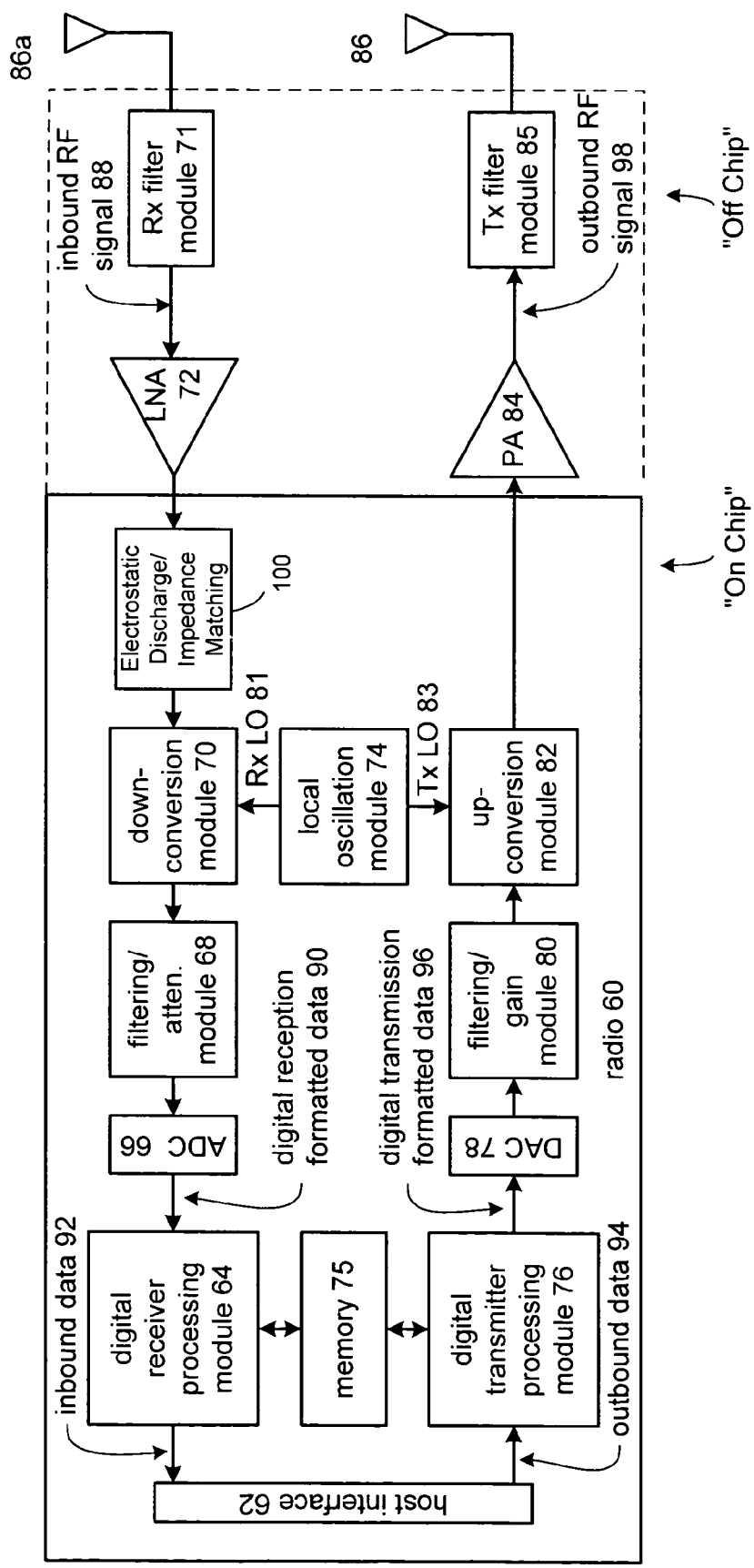
FIG. 7 illustrates a schematic block diagram of a fourth alternate embodiment radio module of a wireless communication device incorporating an electrostatic-discharge/impedance-matching circuit in accordance with the present invention.

FIG. 7 illustrates another embodiment of the present invention wherein the electrostatic-discharge/impedance-matching circuit 100 is incorporated into a radio 60 that utilizes separate transmit and receive antennas 86 and 86a, respectively. In this embodiment, the electrostatic-discharge/impedance-matching circuit 100 is connected between the low-noise amplifier 72 and the down-conversion module 70. In the illustration shown in FIG. 7, the circuit components for the power amplifier module 84, the Tx filter module 85, the Rx filter module 71 and the low-noise amplifier 72 are formed "off-chip," while all of the other circuit components of the radio 60 are formed on a single integrated circuit. The electrostatic-discharge/impedance-matching circuit 100 is, therefore, located on the boundary of the chip to protect against damage from static discharges at the input connection where an inbound RF signal is received from the low-noise amplifier 72. Again, as discussed in connection with previous embodiments, the electrostatic-discharge/impedance-matching circuit 100 comprises a combination of circuit components that provide a matched input impedance to the low-noise amplifier 72.

Figure 8:
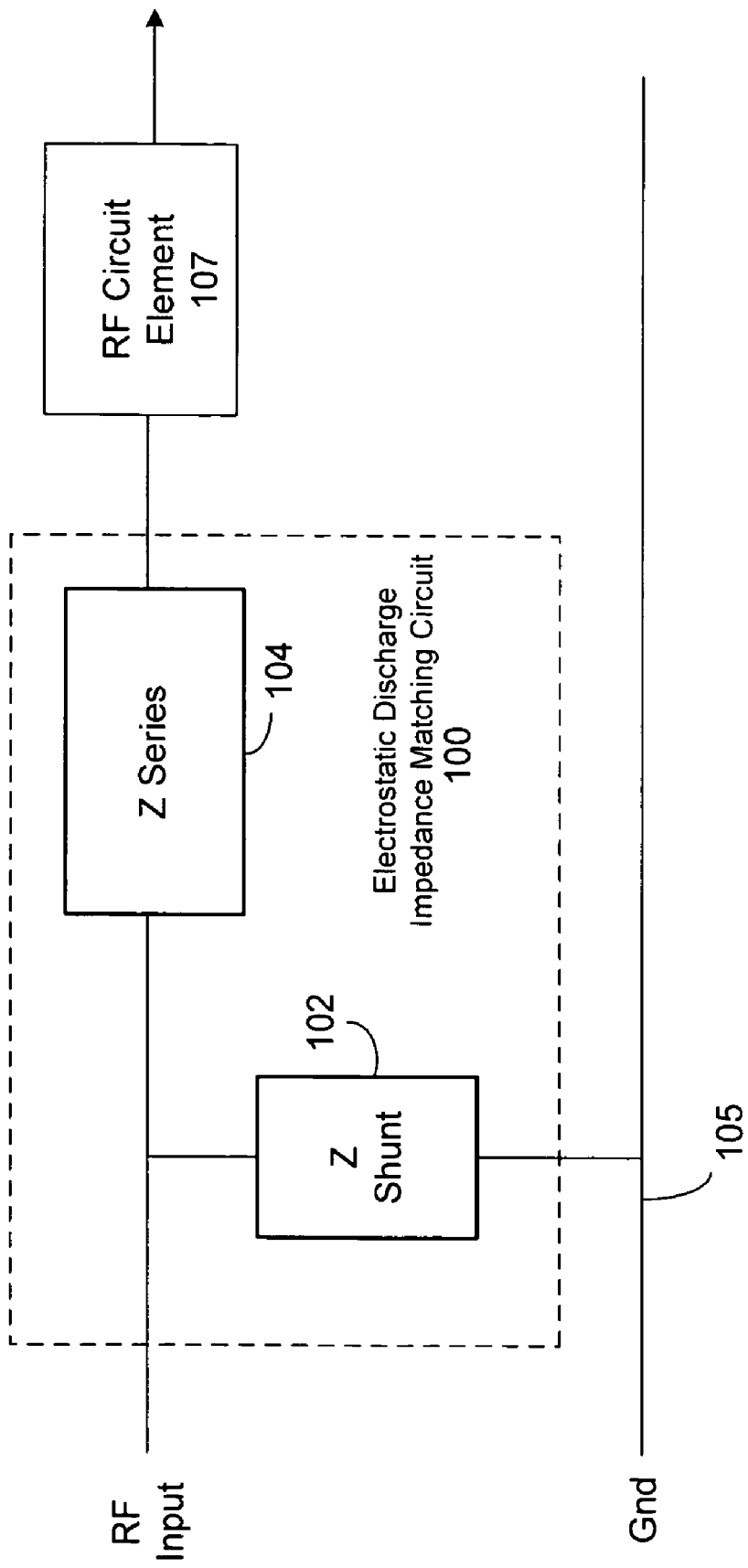
FIG. 8 illustrates a schematic block diagram of the functional components of an electrostatic-discharge/impedance-matching circuit in accordance with the present invention.

FIG. 8 is a schematic block diagram illustration of an embodiment of the electrostatic-discharge/impedance-matching circuit 100 comprising a shunt impedance 102 and a series impedance 104. As will be appreciated by those of skill in the art, the impedance values of the shunt impedance 102 and the series impedance 104 can be selected to optimize the dissipation of electrostatic discharges at the RF input through the shunt impedance 102 to the ground line 105. Moreover, the combined impedance of the shunt and series impedance elements 102 and 104, can also be optimized to provide impedance matching between the RF input and the RF circuit component 107, which can be an Rx filter module 71, low-noise amplifier 72 or other RF circuit component on the boundary of the integrated circuit module.

Figure 9:
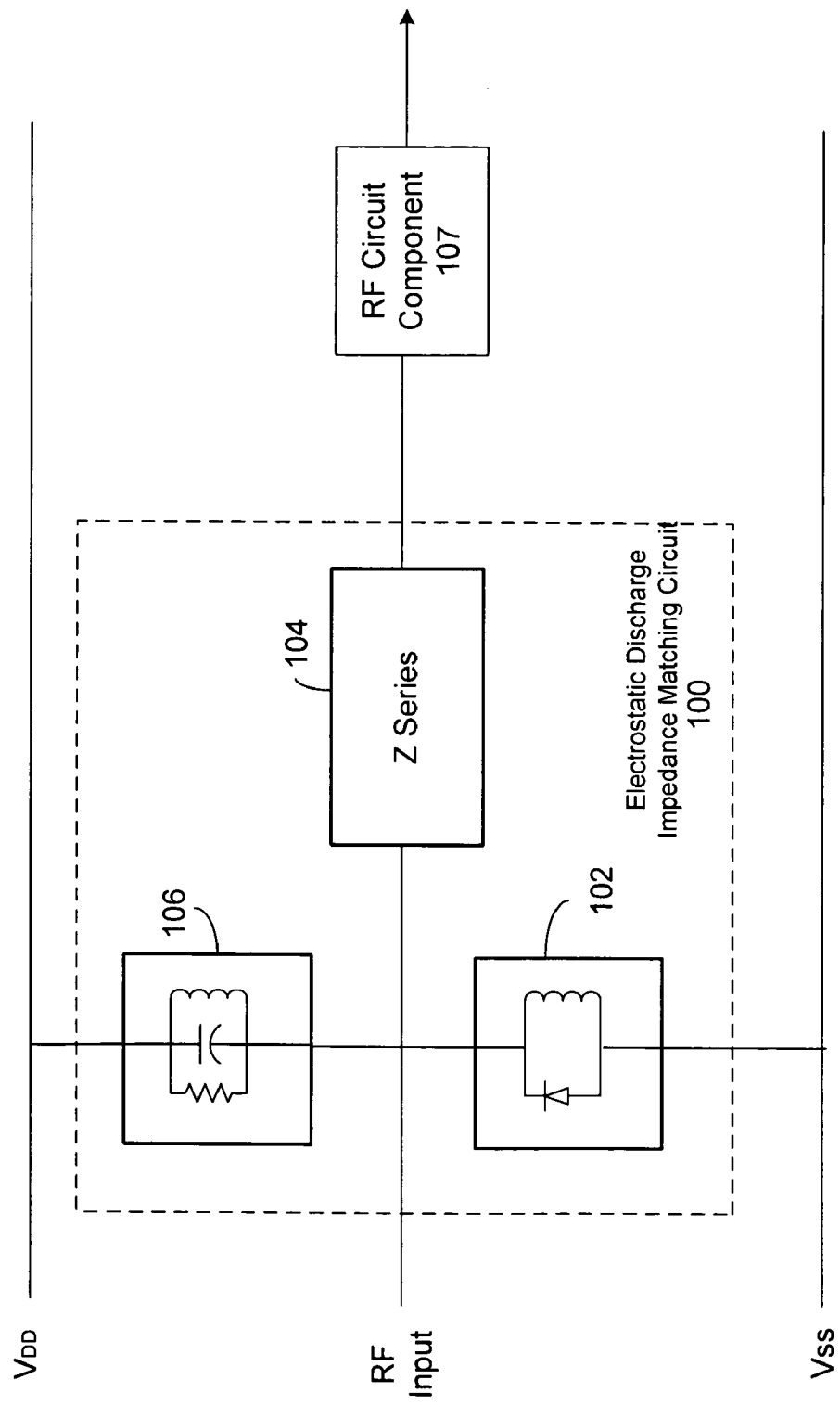
FIG. 9 illustrates a schematic block diagram of an alternate embodiment of an electrostatic-discharge/impedance-matching circuit in accordance with the present invention.

FIG. 9 is a schematic block diagram illustration of another embodiment of the electrostatic-discharge/impedance-matching circuit 100 comprising a first and second shunt impedance elements 102 and 106, respectively, and a series impedance 104. The first shunt element 102 is connected between the RF input and Vss and the second shunt element 106 is connected between the RF input and Vdd. As discussed above, it will be appreciated by those of skill in the art that the impedance values of the first and second shunt impedances 102, 106 and the series impedance 104 can be selected to optimize the dissipation of electrostatic discharges at the RF input. Furthermore, the combined impedance of the first and second shunt impedances and series impedance can also be optimized to provide impedance matching between the RF input and the RF circuit component 107, which can be an Rx filter module 71, low-noise amplifier 72 or other RF circuit component on the boundary of the integrated circuit module. Various discrete circuit components, known to those skilled in the art, can be combined to obtain the desired impedances for each of the shunt and series impedance elements discussed above. By was of illustration, shunt element 102 is shown to comprise a diode and resistor combination, while shunt element 106 is shown to comprise a resistor, inductor and capacitor combination.

Figure 10:
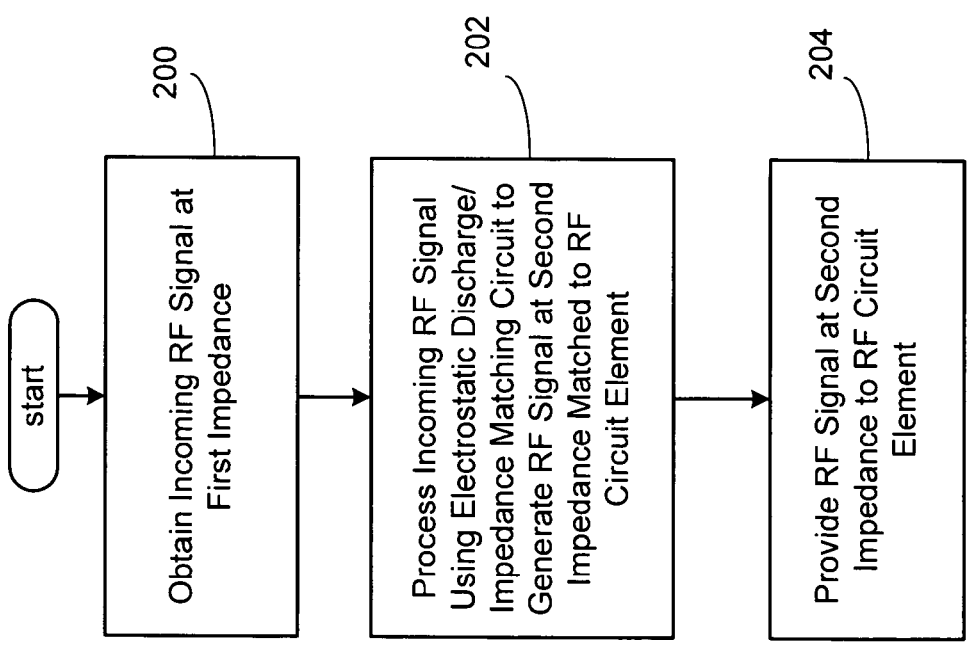
FIG. 10 illustrates a flowchart diagram of a method for using the electrostatic discharge and impedance matching circuit of the present invention to process an incoming radio frequency signal.

FIG. 10 is a flowchart illustration of the processing steps for using the electrostatic-discharge/impedance-matching circuit of the present invention to process an incoming RF signal. In step 200, an incoming RF signal at a first impedance is obtained from an antenna, such as antenna 86 or from an RF circuit component, such as Rx filter 71. In step 202 the incoming RF signal is processed using the electrostatic-discharge/impedance-matching circuit 100 to generate an RF signal at a second impedance that is matched to the input impedance of an RF circuit element. In step 204, the RF signal at the second impedance is provided to an RF circuit element in the wireless receiver for further signal processing.

The preceding discussion has presented a circuit for providing electrostatic discharge and impedance matching that may be used in a radio transmitter or radio transceiver. As one of skill in the art will appreciate, other embodiments may be derived from the teaching of the present invention, without deviating from the scope of the claims.

The invention claimed is:

1. A wireless communication device comprising:
   a case;
   an antenna; and
   a radio at least partially contained in the case and comprising:
      a baseband processor;
      an RE front end circuit formed in an integrated circuit and having an antenna interface; and
      an electrostatic discharge circuit formed in the integrated circuit and communicatively coupled between the antenna and the antenna interface of the RF front end circuit, wherein the elecirostatic discharge circuit is operable to protect the RF front end circuit from an over-voltage condition and wherein the electrostatic discharge circuit provides a matched impedance to the antenna, the electrostatic discharge circuit comprising:
         at least one shunt circuit operable to shunt current related to an over-voltage condition, the at least one shunt circuit including an over voltage clamp and an impedance matching shunt element; and
         at least one series element operably coupled to the at least one shunt element including at least one impedance matching series element.

2. The wireless communication device of claim 1, further comprising a host device interface communicatively coupled to the radio.

3. The wireless communication device of claim 1, wherein the radio supports wireless local area network communications.

4. The wireless communication device of claim 1, wherein the radio supports wireless personal area network communications.

5. The wireless communication device of claim 1, wherein the radio supports cellular wireless network communications.

6. The wireless communication device of claim 1, wherein the electrostatic discharge circuit provides a matched impedance of 50 ohms to the antenna.

7. The wireless communication device of claim 1, further comprising a user interface.

8. The wireless communication device of claim 1:
   further comprising a switch module formed in the integrated circuit;
   wherein the electrostatic discharge circuit couples between the antenna and the switch module; and
   wherein the switch module couples between the antenna interface of the RF front end circuit and the electrostatic discharge circuit.

9. The wireless communication device of claim 1, further comprising a switch module formed external to the integrated circuit and coupled between the antenna and the electrostatic discharge circuit.

10. The wireless communication device of claim 1, further comprising:
    a switch module communicatively coupled to the antenna; and
    a filter module communicatively coupled between the switch module and the electrostatic discharge circuit.

11. The wireless communication device of claim 10, wherein:
    the RF front end circuit further comprises a receive filter formed in the integrated circuit; and
    wherein the electrostatic discharge circuit communicatively couples between the antenna and the receive filter.

12. A wireless communication device comprising:
    a case;
    an antenna for receiving an inbound RF signal;
    an RF front end receiver formed in an integrated circuit and having an input that receives and processes the inbound RF signal; and
    an electrostatic discharge circuit formed in the integrated circuit and connected between the antenna and the input of the RF front end receiver, wherein the electrostatic discharge circuit is operable to protect the RF front end circuit from an over-voltage condition and wherein the electrostatic discharge circuit provides a matched input impedance to the antenna, the electrostatic discharge circuit comprising:
       at least one shunt circuit operable to shunt current related to an over-voltage condition, the at least one shunt circuit including an over voltage clamp and an impedance matching shunt element; and
       at least one series element operably coupled to the at least one shunt element including at least one impedance matching series element.

13. The wireless communication device of claim 12, further comprising a host device interface communicatively coupled to the radio.

14. The wireless communication device of claim 12, wherein the RF front end receiver supports wireless local area network communications.

15. The wireless communication device of claim 12, wherein the RF front end receiver supports wireless personal area network communications.

16. The wireless communication device of claim 12, wherein the RF front end receiver supports cellular wireless network communications.

17. The wireless communication device of claim 12, wherein the electrostatic discharge circuit provides a matched impedance of 50 ohms to the antenna.

18. The wireless communication device of claim 12, further comprising a user interface.

19. The wireless communication device according to claim 12, wherein the electrostatic discharge circuit comprises a single input and a single output.

20. The wireless communication device of claim 12, wherein the electrostatic discharge circuit comprises a single input and first and second differential outputs.

* * * * *

UNITED STATES PATENT AND TRADEMARK OFFICE
CERTIFICATE OF CORRECTION

PATENT NO. : 7,212,801 B2  Page 1 of 1
APPLICATION NO. : 10/884034
DATED : May 1, 2007
INVENTOR(S) : John Leete It is certified that error appears in the above-identified patent and that said Letters Patent is hereby corrected as shown below:

Column 9, line 44, in Claim 1: replace "RE" with --RF--

Column 1, line 11: replace "6,771,475)." with --6,771,475.--

Signed and Sealed this

Twenty-ninth Day of July, 2008

JON W. DUDAS
*Director of the United States Patent and Trademark Office*